(12) United States Patent
Kurachi et al.

(10) Patent No.: US 12,154,917 B2
(45) Date of Patent: Nov. 26, 2024

(54) SEMICONDUCTOR IMAGE SENSOR

(71) Applicant: Optohub Co., Ltd, Nagano (JP)

(72) Inventors: Ikuo Kurachi, Tokyo (JP); Hiroshi Takano, Tokyo (JP); Yasumasa Kashima, Tokyo (JP)

(73) Assignee: Optohub Co., Ltd, Nagano (JP)

( * ) Notice: Subject to any disclaimer, the term of this patent is extended or adjusted under 35 U.S.C. 154(b) by 485 days.

(21) Appl. No.: 17/603,572

(22) PCT Filed: Apr. 10, 2020

(86) PCT No.: PCT/JP2020/016184
§ 371 (c)(1),
(2) Date: Oct. 13, 2021

(87) PCT Pub. No.: WO2021/205662
PCT Pub. Date: Oct. 14, 2021

(65) Prior Publication Data
US 2022/0199661 A1   Jun. 23, 2022

(51) Int. Cl.
*H01L 27/146* (2006.01)
(52) U.S. Cl.
CPC .... *H01L 27/14603* (2013.01); *H01L 27/1463* (2013.01); *H01L 27/14649* (2013.01); *H01L 27/14689* (2013.01)
(58) Field of Classification Search
CPC ........... H01L 27/14603; H01L 27/1463; H01L 27/14649; H01L 27/14689; H01L 21/8234;
(Continued)

(56) References Cited

U.S. PATENT DOCUMENTS

| 10,312,275 B2 * | 6/2019 | Hynecek | G01S 17/10 |
| 2019/0103504 A1 * | 4/2019 | Yamashita | H01L 27/14636 |
| 2020/0286946 A1 * | 9/2020 | Mandai | G01S 7/4863 |

FOREIGN PATENT DOCUMENTS

| JP | H07177729 | 7/1995 |
| JP | 2001503918 | 3/2001 |

(Continued)

OTHER PUBLICATIONS

I. Oshiyama et al., "Near-infrared sensitivity enhancement of a back-illuminated complementary metal oxide semiconductor image sensor with a pyramid surface for diffraction structure", 2017 IEEE International Electron Devices Meeting (IEDM), Dec. 2-6, 2017, pp. 397-400.

(Continued)

*Primary Examiner* — Shouxiang Hu
(74) *Attorney, Agent, or Firm* — JCIPRNET

(57) ABSTRACT

The semiconductor image sensor of the present invention comprises a light receiving element formed in a silicon substrate under an insulation film of an SOI substrate comprising the silicon substrate, the insulation film formed on the silicon substrate, and a semiconductor layer formed on the insulation film, and composed of a pn junction diode formed in a vertical direction to a main surface of the silicon substrate and having sensitivity to near-infrared light, and a high voltage generating circuit configured to generate an applied voltage for applying a reverse bias voltage to the pn junction diode, and an impurity concentration of the silicon substrate is in a range of $1\times10^{12}/cm^3$ to $1\times10^{14}/cm^3$, a film thickness is in a range of 300 μm to 700 μm, and the applied voltage is in a range of 10 V to 60 V.

4 Claims, 18 Drawing Sheets

A-A' cross-sectional schematic view

100: Sensor circuit unit
100a: Light receiving unit
101: Low-concentration N-type silicon substrate
102: Buried oxide film (BOX)
103: N⁺ layer
104: N⁻ diffusion layer
105: P⁻ diffusion layer
106: P-well layer
107: SOI layer
108: Gate electrode
109: Metal wiring layer
109a: Aluminum wiring
109b: Counter electrode
110a, 110b, 110c: SOI-MOSFET
111: MIM Capacitor
112: BOX Capacitor
200: High voltage generating circuit unit
1000: Optical sensor

(58) Field of Classification Search
CPC ..... H01L 27/06; H01L 27/088; H01L 27/144; H01L 27/146; H01L 29/66477; H01L 29/786; H04N 25/70
See application file for complete search history.

(56) References Cited

FOREIGN PATENT DOCUMENTS

| | | |
|---|---|---|
| JP | 2003520441 | 7/2003 |
| JP | 2005340479 | 12/2005 |
| JP | 2010041010 | 2/2010 |
| JP | 2017108062 | 6/2017 |

OTHER PUBLICATIONS

"International Search Report (Form PCT/ISA/210) of PCT/JP2020/016184", mailed on Jul. 7, 2020, pp. 1-2.

* cited by examiner (1) SOI wafer (2) Active formation (3) Element isolation (4) Channel doping (9) Formation of sense node diffusion layer

(10) Formation of Nch/Pch source-drain

(11) Formation of interlayer insulation film

(12) Formation of contact hole

(13) Formation of tungsten plug

(14) Formation of aluminum wiring

(15) Formation of uppermost layer metal, formation of protective film, and pad opening

(16) Backside treatment (A)

(B)

(C)

SEMICONDUCTOR IMAGE SENSOR

CROSS-REFERENCE TO RELATED APPLICATION

This application is a 371 application of an international PCT application serial no. PCT/JP2020/016184, filed on Apr. 10, 2020. The entirety of the above-mentioned patent application is hereby incorporated by reference herein and made a part of this specification.

TECHNICAL FIELD

The present invention relates to a semiconductor image sensor, in particular, to a semiconductor image sensor that has high sensitivity to near-infrared light and can be integrated in a small area.

BACKGROUND ART

As a well-known semiconductor image sensor (hereinafter referred to as an optical sensor), one that uses a pn junction diode formed in a silicon substrate as a light receiving element is well-known. In order to operate this optical sensor, it is necessary to first apply reverse bias voltages to the pn junction diode, i.e., apply a negative bias voltage to a p-type semiconductor layer and a positive bias voltage to an n-type semiconductor layer. This forms a depletion layer without carriers in the pn junction. When this depletion layer is irradiated with light, electron-hole pairs (carriers) are generated by the light energy (referred to as a photoelectric effect), electrons are attracted into the n-type semiconductor layer to which a positive voltage is applied while holes are attracted to the p-type semiconductor layer to which a negative voltage is applied, by an electric field in the depletion layer. With this, since the electric charge amount between the terminals of the pn junction diode varies in accordance with an optical signal, the optical signal can be converted into an electrical signal (referred to as a photoelectric conversion).

In the photoelectric conversion by the pn junction diode using the silicon substrate, a limit of detectable light on the long wavelength side (low light energy side) is determined by a bandgap width in the silicon.

Since the bandgap width of silicon is about 1.1 eV, the optical sensor using the pn junction diode made of silicon can only detect light having a wavelength of about 1,100 nm or less.

This wavelength (about 1,100 nm) is in a near-infrared region.

FIG. 1 shows absorption coefficient of light using silicon as a medium, and the light absorption coefficient of near-infrared light having a wavelength near 1,100 nm is small and detection sensitivity is low. Therefore, the sensitivity to near-infrared light has been conventionally enhanced by making some improvements of a silicon optical sensor.

As one of the improvements, Patent Document 1 and Non-Patent Document 1 describe that near-infrared light incident on the optical sensor is dispersed in the optical sensor, thereby extending an optical path length along which the near-infrared light passes through the optical sensor to enhance the sensitivity. Specifically, this has been achieved by forming pyramidal unevenness on a surface of the silicon in which a light receiving element is formed.

Further, the sensitivity has been enhanced by forming a specific layer that is referred to as a diffuser on a surface of the light receiving element to disperse near-infrared light.

However, these conventional methods cause an increase in a manufacturing process and are accompanied by an increase in cost. In addition, the dispersion of the near-infrared light alone has not led to enough sensitivity improvement and has limitations.

On the other hand, a method of thickening a depletion layer serving as a photoelectric conversion region is effective to enhance the sensitivity.

FIG. 2 shows a relationship between a depletion layer width and light absorptivity for each light wavelength. This drawing shows that if a depletion layer width can be controlled at 300 μm or greater, sufficient light absorption to light in a near-infrared region can be obtained.

FIG. 3 shows a relationship between a reverse bias voltage and a depletion layer width for an impurity concentration of the silicon substrate in which a pn junction is formed.

Although a concentration in a silicon substrate in general use is about $1 \times 10^{15}/cm^3$, it is shown that when a low-concentration substrate (to $1 \times 10^{12}/cm^3$) is used, the depletion layer width is increased by about one order of magnitude at the same bias voltage.

FIG. 4 shows a relationship between a reverse bias voltage and a substrate impurity concentration to have a similar degree of sensitivity to visible light, using a light wavelength as a parameter.

It shows that it is necessary to apply a bias voltage of about 50V, in order to obtain an optical sensor that has a similar degree of sensitivity to visible light, for near-infrared light having a wavelength of 940 nm, using an FZ substrate having the substrate concentration of about $2 \times 10^{12}/cm^3$.

Therefore, the optical sensor includes a high voltage generating circuit that generates a high voltage to apply a reverse bias voltage to a pn junction diode. The high voltage generating circuit is generally a circuit for boosting a power-supply voltage (VCC) to obtain a predetermined high voltage, and a charge pump circuit is known.

The charge pump circuit is a circuit that is realized by turning an input signal (power-supply voltage: VCC) on and off using capacitors (C1 to C9) and diodes (D1 to D9), various circuit configurations are known, and one example of them is shown in FIG. 5.

Formation of this charge pump circuit in a silicon substrate suffers from the disadvantages of an increase in the occupied area and of an increase in size of the optical sensor.

Then, it is also well-known as shown in Patent Document 2, that the charge pump circuit is formed in a semiconductor layer of an SOI substrate that includes a silicon substrate, an insulation film formed on the silicon substrate, and the semiconductor layer formed on the insulation film. In the charge pump circuit that is disclosed in this document, a p-type region and an n-type region formed in the semiconductor layer are joined to form a plurality of mutually independent diodes, and the diodes are connected in series.

PRIOR ART DOCUMENT

Patent Document

Patent Document 1: Japanese Patent Application Publication No. 2017-108062
Patent Document 2: Japanese Patent Application Publication No. H7-177729

Non-Patent Document

Non-Patent Document 1: Oshiyama et al., "Near-infrared sensitivity enhancement of a back-illuminated complementary metal oxide semiconductor image sensor with a pyramid surface for diffraction structure," IEEE Tech. Digest. of IEDM 2017, pp. 397-400, 2017.

SUMMARY OF THE INVENTION

Problems to be Solved by the Invention

It is an object of the present invention to achieve a semiconductor image sensor that can obtain a sufficiently thick (wide) depletion layer when a high reverse bias voltage is applied to a pn junction diode serving as a light receiving element which is formed in a silicon substrate and that does not lead to an increase in an area occupied by a high voltage generating circuit.

Means for Solving the Problems

The semiconductor image sensor of the present invention is characterized by comprising a light receiving element formed in a silicon substrate under an insulation film of an SOI substrate comprising the silicon substrate, the insulation film formed on the silicon substrate, and a semiconductor layer formed on the insulation film, and composed of a pn junction diode formed in a vertical direction to a main surface of the silicon substrate and having sensitivity to near-infrared light, and a high voltage generating circuit configured to generate an applied voltage for applying a reverse bias voltage to the pn junction diode, and in that an impurity concentration of the silicon substrate is in a range of $1 \times 10^{12}/cm^3$ to $1 \times 10^{14}/cm^3$, a film thickness is in a range of 300 μm to 700 μm, and the applied voltage is in a range of 10 V to 60 V.

In addition, the semiconductor image sensor of the present invention is characterized by comprising a BOX capacitor having a first electrode as the semiconductor layer and a second electrode as a diffusion layer formed in the silicon substrate, via the insulation film, and in that the first electrode is connected to an output of the high voltage generating circuit.

In addition, the semiconductor image sensor of the present invention is characterized in that a film thickness of the insulation film of the BOX capacitor is in a range of 100 nm to 300 nm.

The semiconductor image sensor of the present invention is characterized by comprising a first region and a second region formed in the semiconductor layer on the insulation film and in contact with each other with a channel region therebetween, and a gate electrode formed on the channel region, the first region and the channel region having the same conductivity type, the second region and the channel region having different conductivity types from each other, and in that the gate electrode and the second region are connected to use the first region and the second region via the channel region as a diode, and a charge pump circuit configured to output a high voltage by connecting a plurality of the diodes in series and giving a signal to each diode is the high voltage generating circuit.

Further, the semiconductor image sensor of the present invention is characterized in that an impurity concentration of the semiconductor layer is in a range of $1 \times 10^{15}/cm^3$ to $3 \times 10^{18}/cm^3$, and a film thickness of the semiconductor layer is in a range of 10 nm to 100 nm.

Advantageous Effect of the Invention

It is possible to achieve a high-sensitivity near-infrared sensor having a single power supply and also suppressing increases in process and area by using an SOI substrate of low impurity concentration, forming a high voltage generating circuit comprising a charge pump circuit in a semiconductor layer of the SOI substrate, and forming a light receiving element composed of a pn junction diode having sensitivity to near-infrared light, in the substrate.

Figure 11:
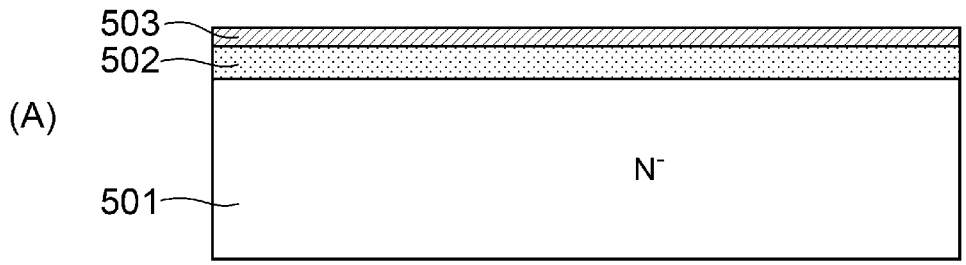
Figure 11:
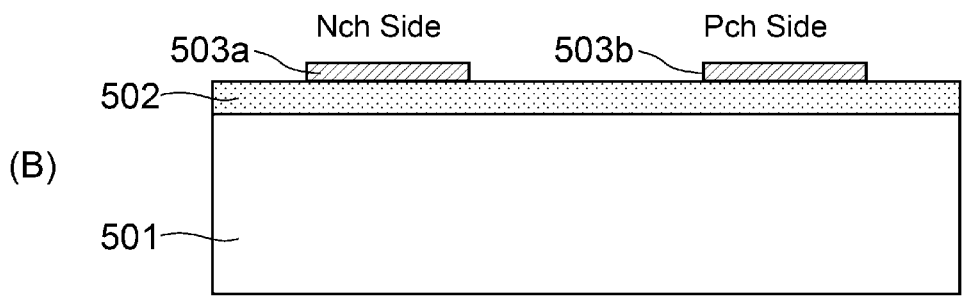
Figure 11:
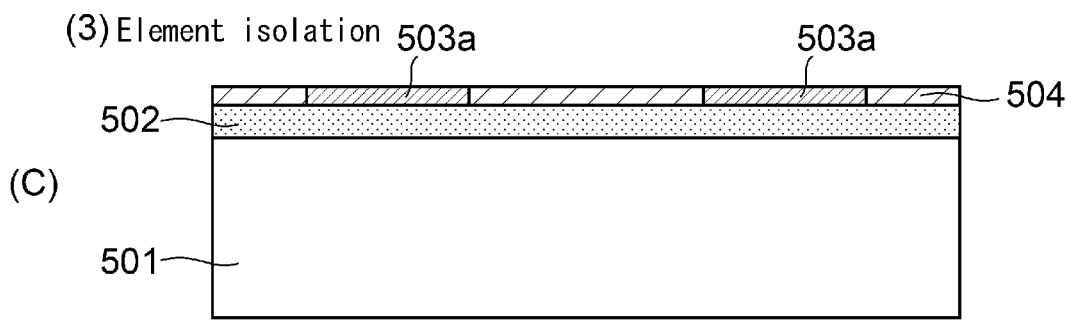
Figure 11:
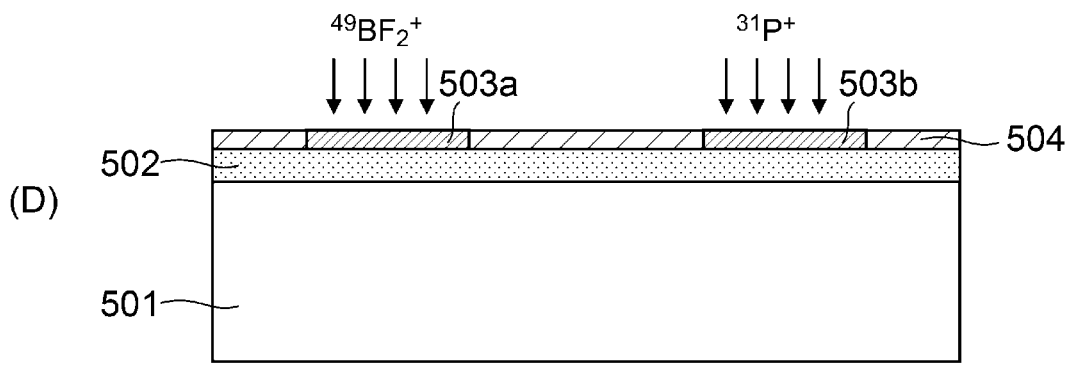

(A) to (D) of FIG. 11 are a manufacturing process view (part 1) of a high voltage generating circuit unit according to the first embodiment of the present invention.

Figure 12:
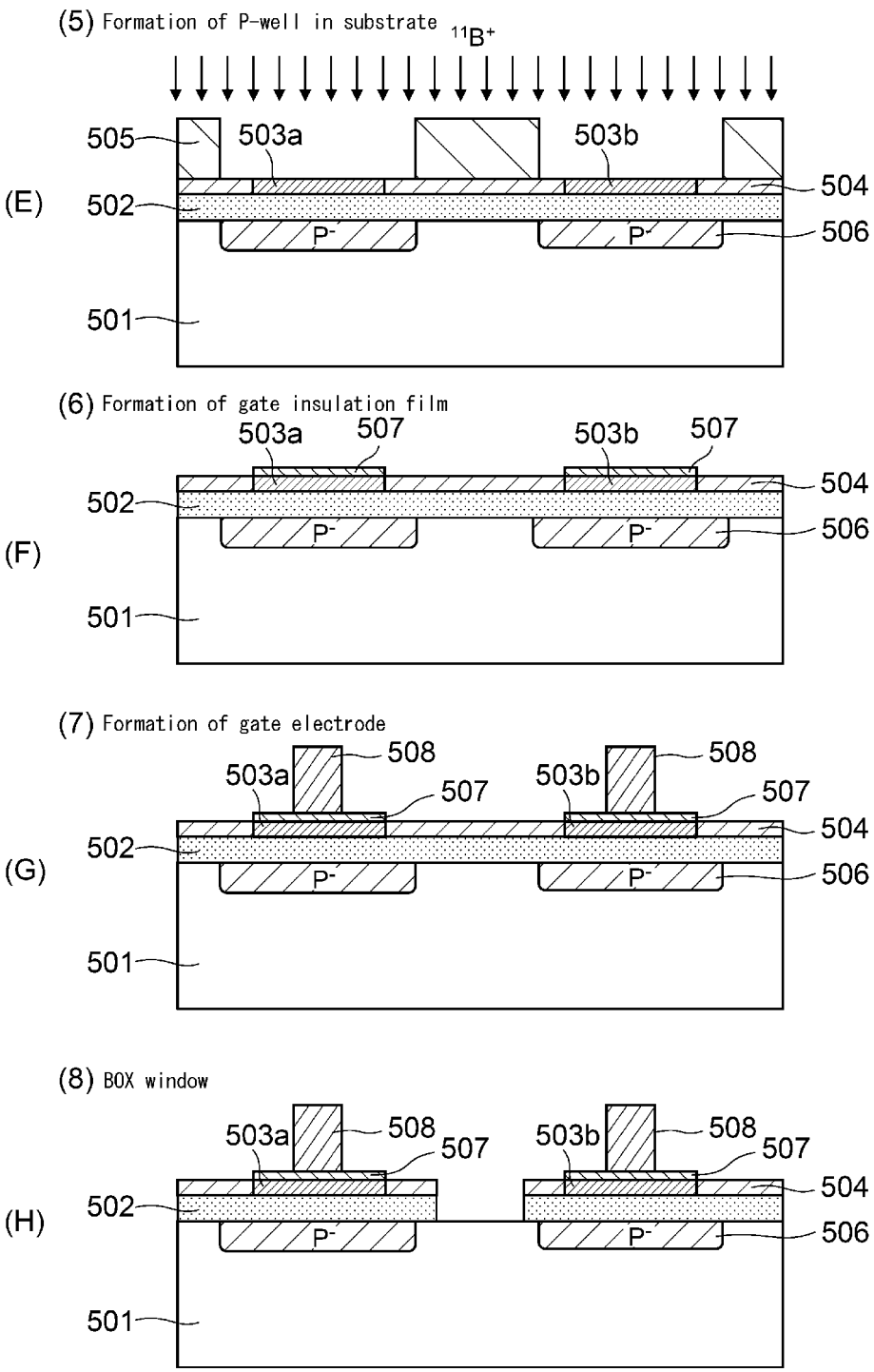

(E) to (H) of FIG. 12 are a manufacturing process view (part 2) of the high voltage generating circuit unit according to the first embodiment of the present invention.

Figure 13:
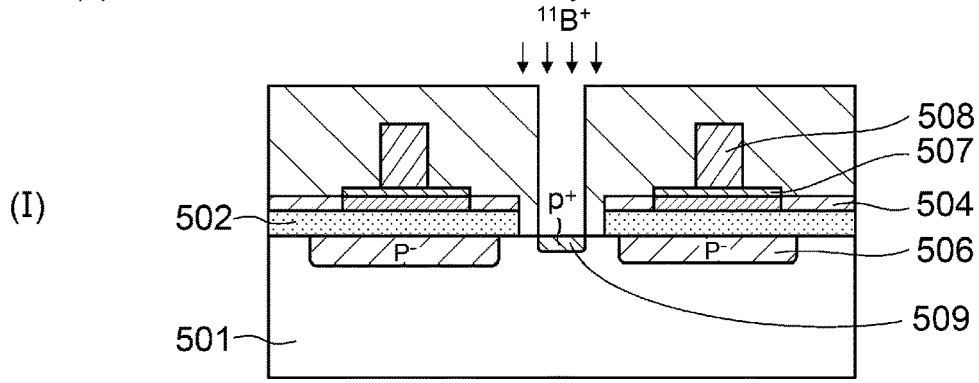
Figure 13:
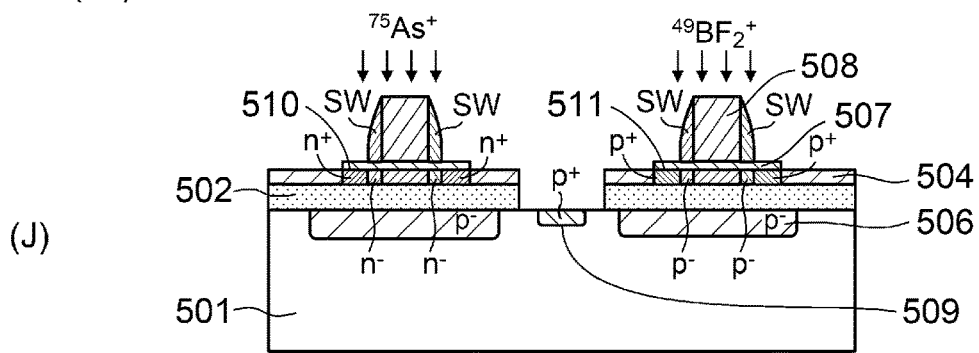
Figure 13:
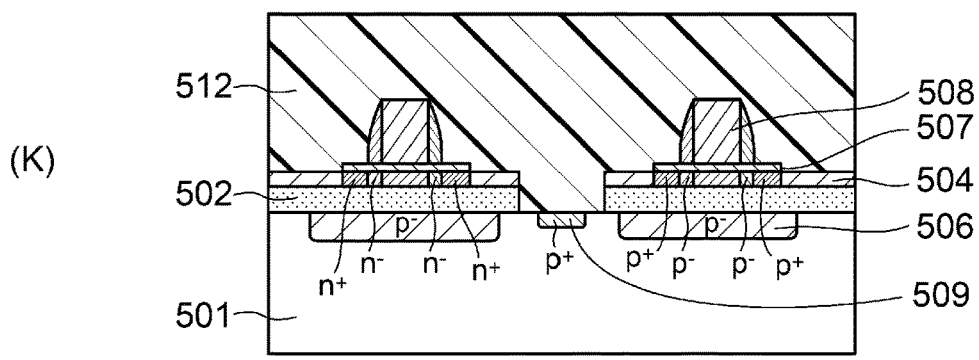
Figure 13:
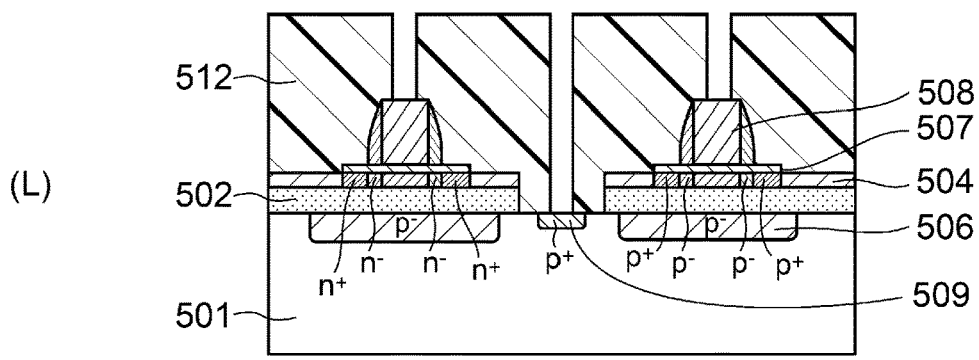

(I) to (L) of FIG. 13 are a manufacturing process view (part 3) of the high voltage generating circuit unit according to the first embodiment of the present invention.

Figure 14:
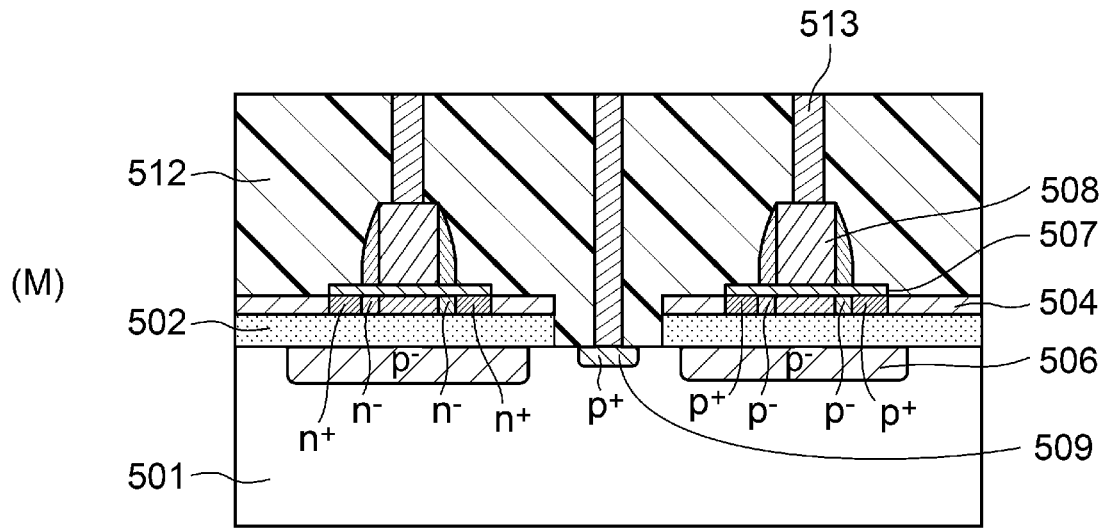
Figure 14:
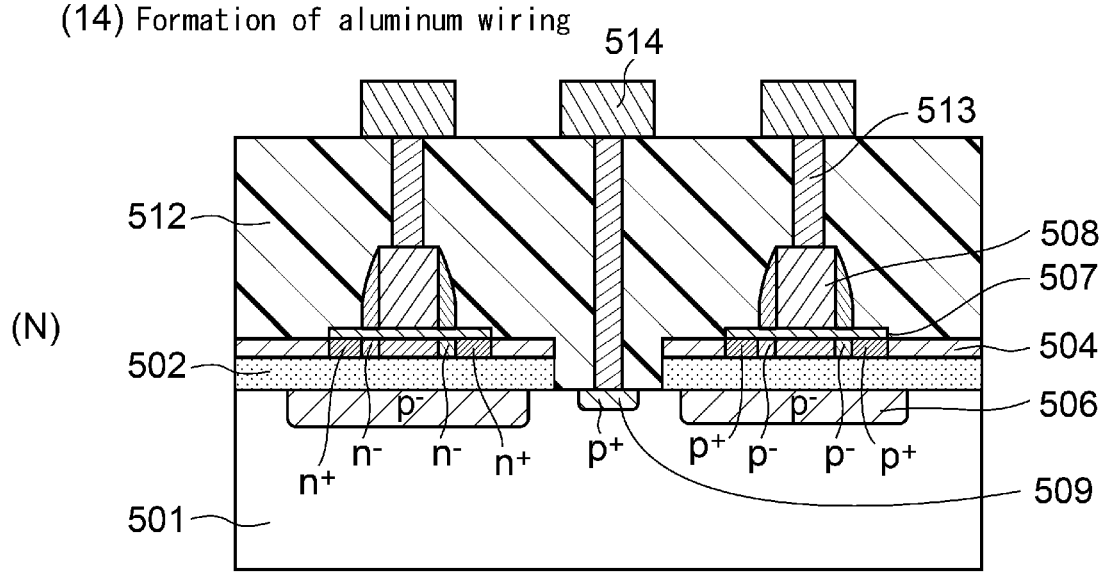

(M) and (N) of FIG. 14 are a manufacturing process view (part 4) of the high voltage generating circuit unit according to the first embodiment of the present invention.

Figure 15:
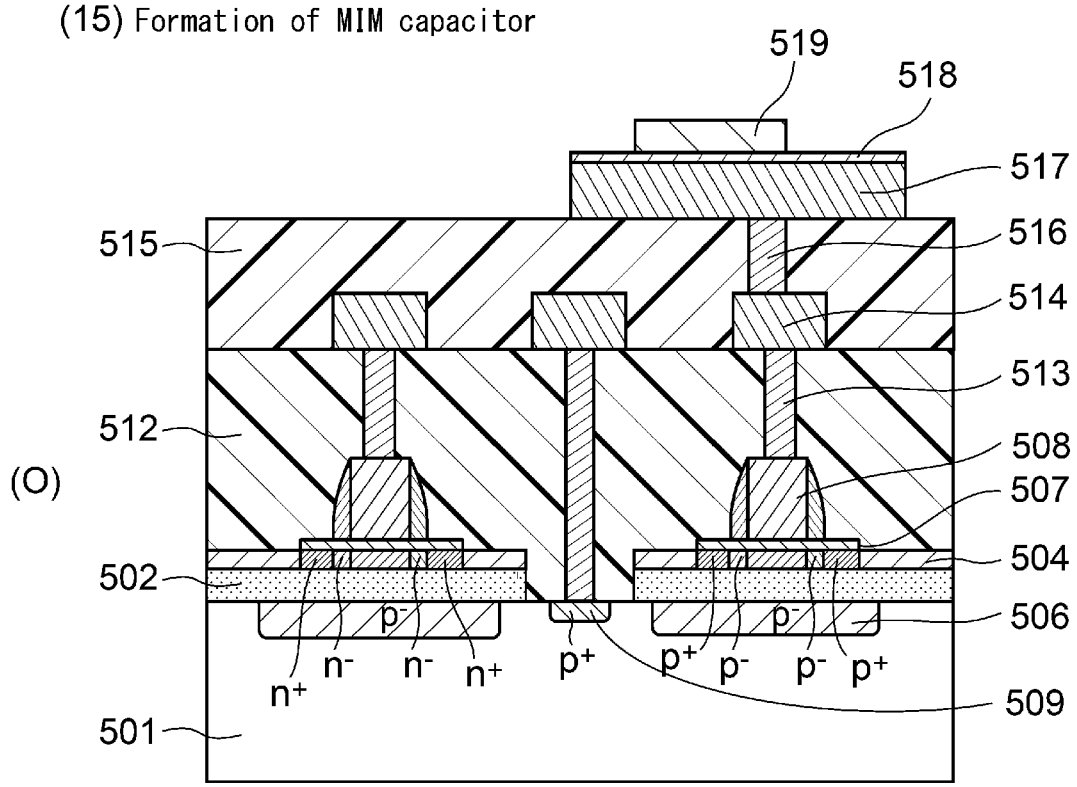

(O) of FIG. 15 is a manufacturing process view (part 5) of the high voltage generating circuit unit according to the first embodiment of the present invention.

Figure 16:
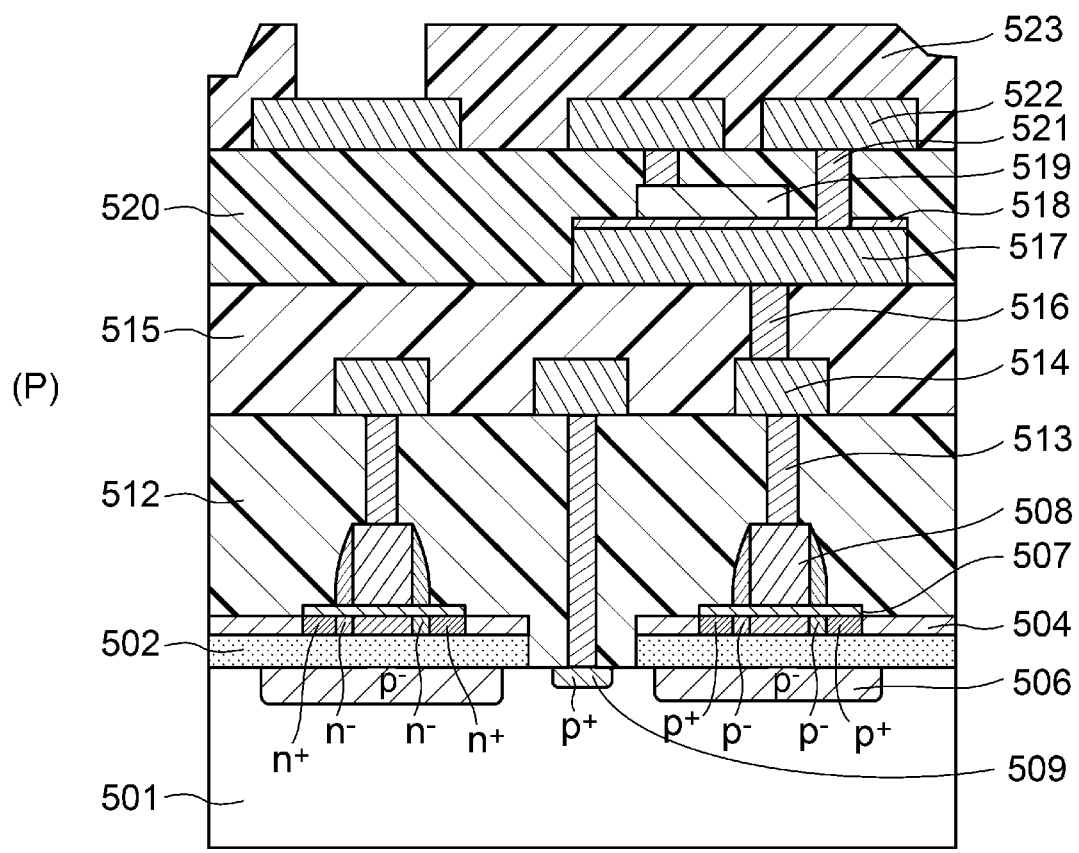

(P) of FIG. 16 is a manufacturing process view (part 6) of the high voltage generating circuit unit according to the first embodiment of the present invention.

Figure 17:
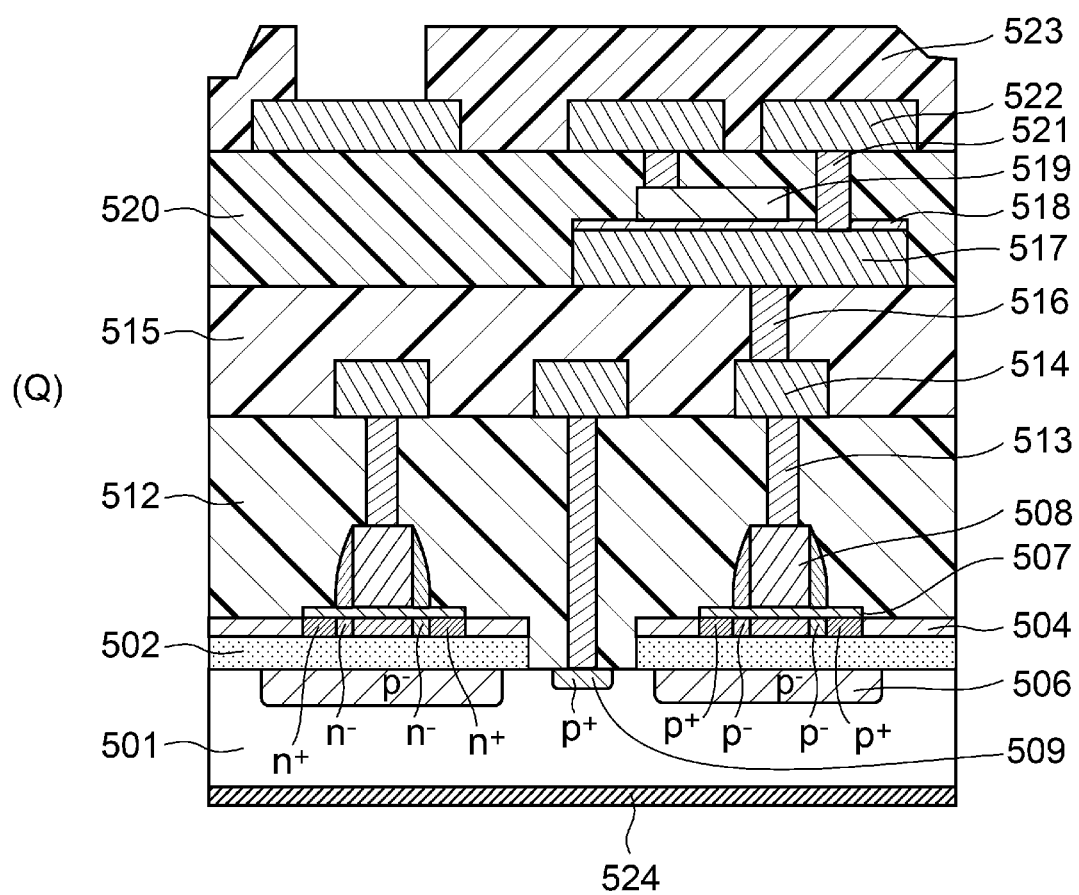

(Q) of FIG. 17 is a manufacturing process view (part 7) of the high voltage generating circuit unit according to the first embodiment of the present invention.

Figure 18:
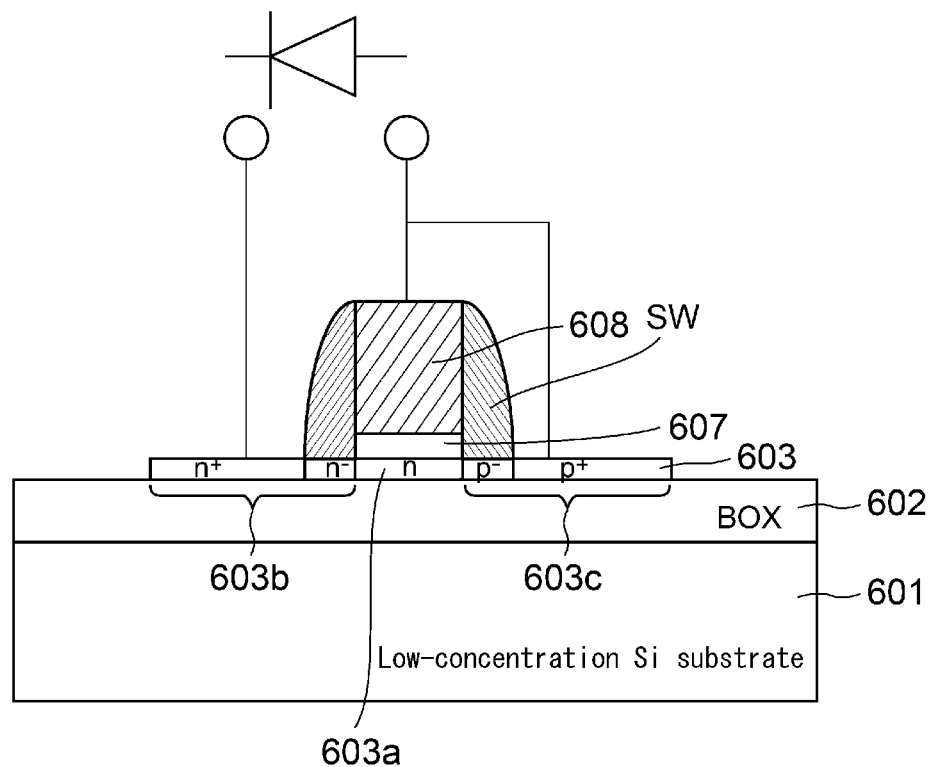

FIG. 18 is a cross-sectional configuration view of a diode that is used in a high voltage generating circuit unit according to the second embodiment of the present invention.

Figure 19:
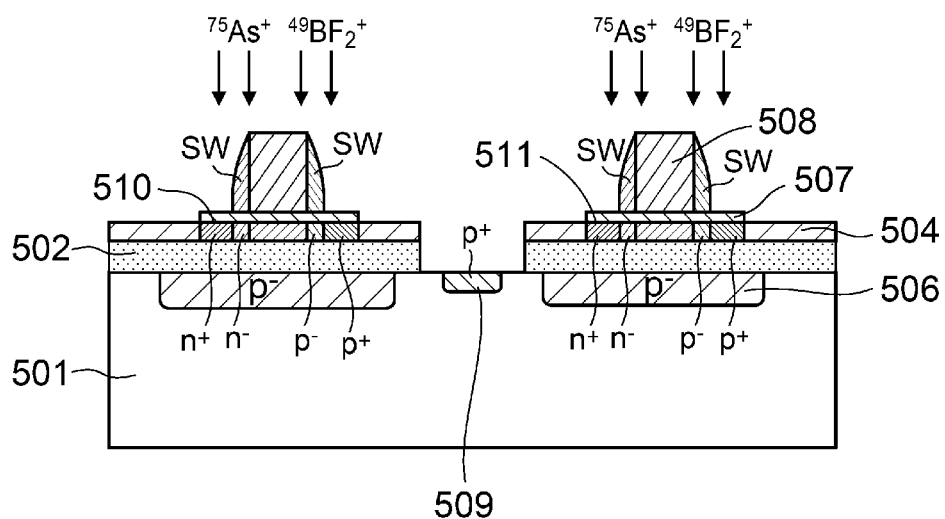

FIG. 19 is a manufacturing process view of the diode shown in FIG. 18.

Figure 20:
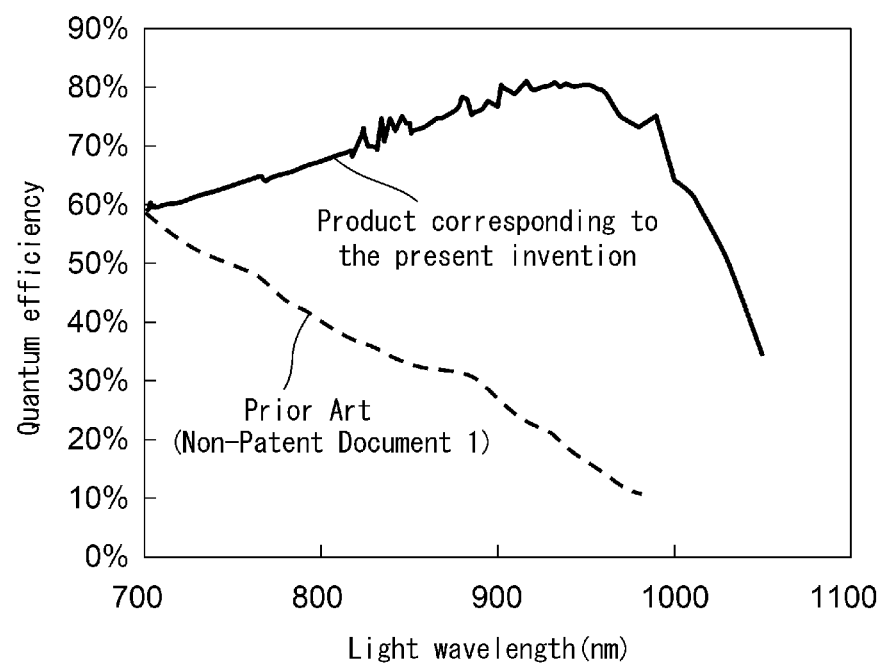

FIG. 20 is a view showing a result of measuring quantum efficiency for a light wavelength when the light receiving element is irradiated with light from the backside.

Figure 21:
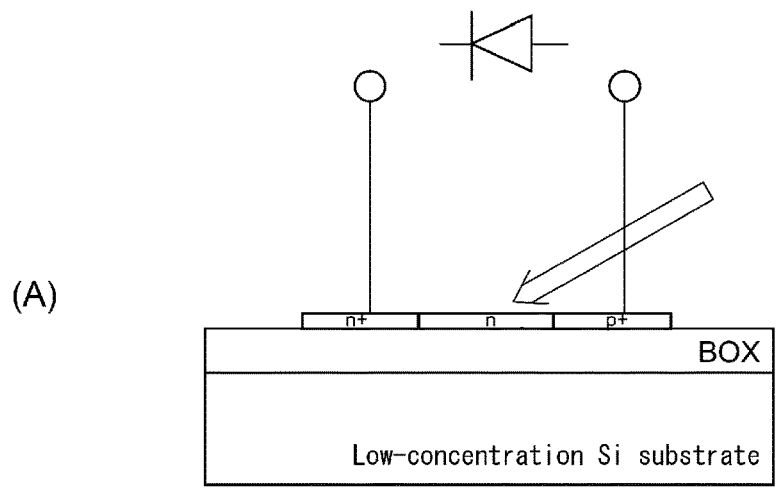
Figure 21:
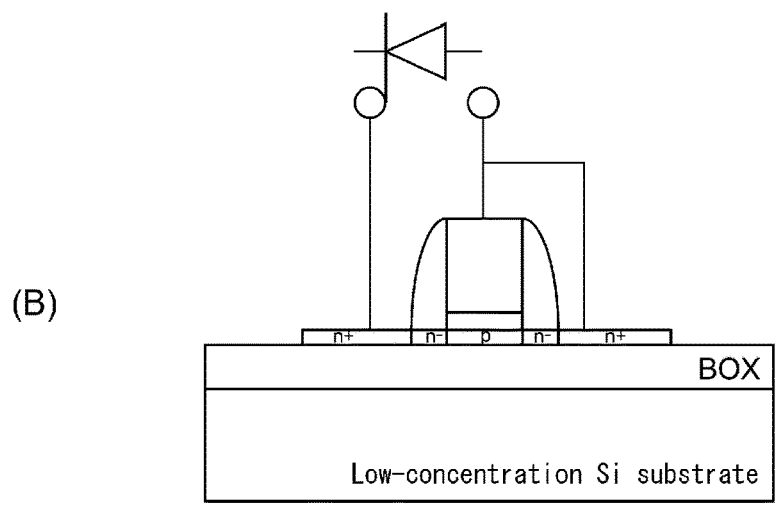
Figure 21:
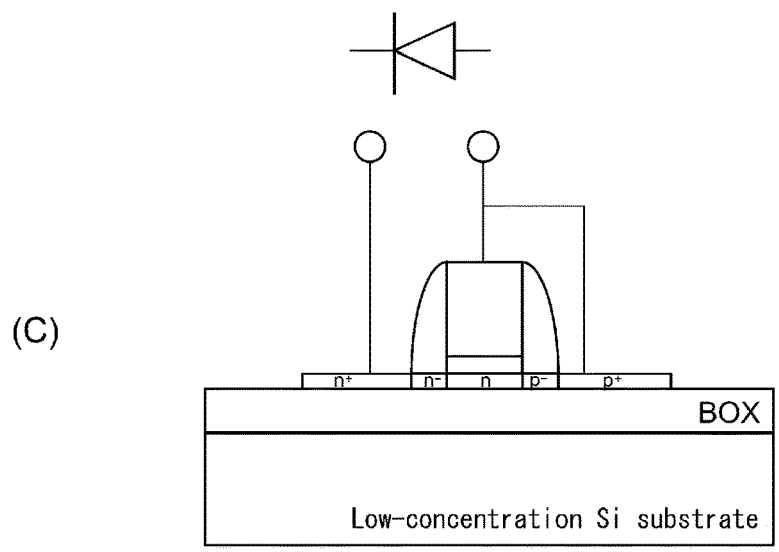

(A) to (C) of FIG. 21 are a view comparing and showing three types of diode structures.

Figure 22:
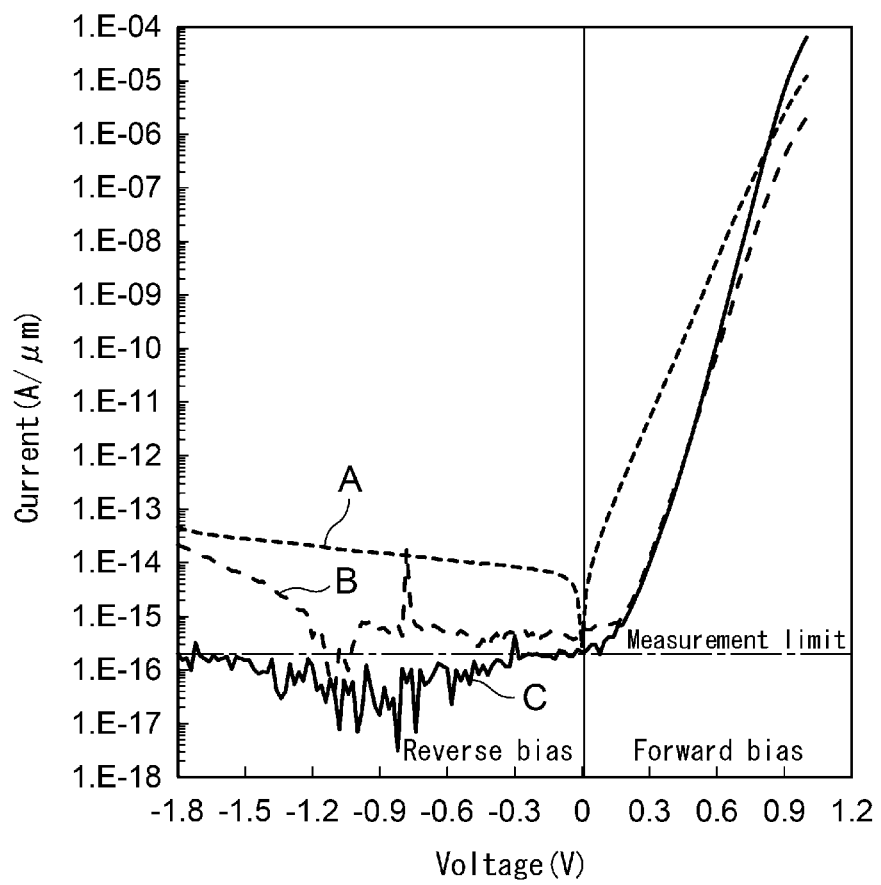

FIG. 22 is a view showing a relationship between a reverse bias voltage and a leak current in the three diode structures shown in FIG. 21.

MODE FOR CARRYING OUT THE INVENTION

Examples of the embodiments of the present invention will be described in detail below with reference to the drawings.

First Embodiment

Figure 6:
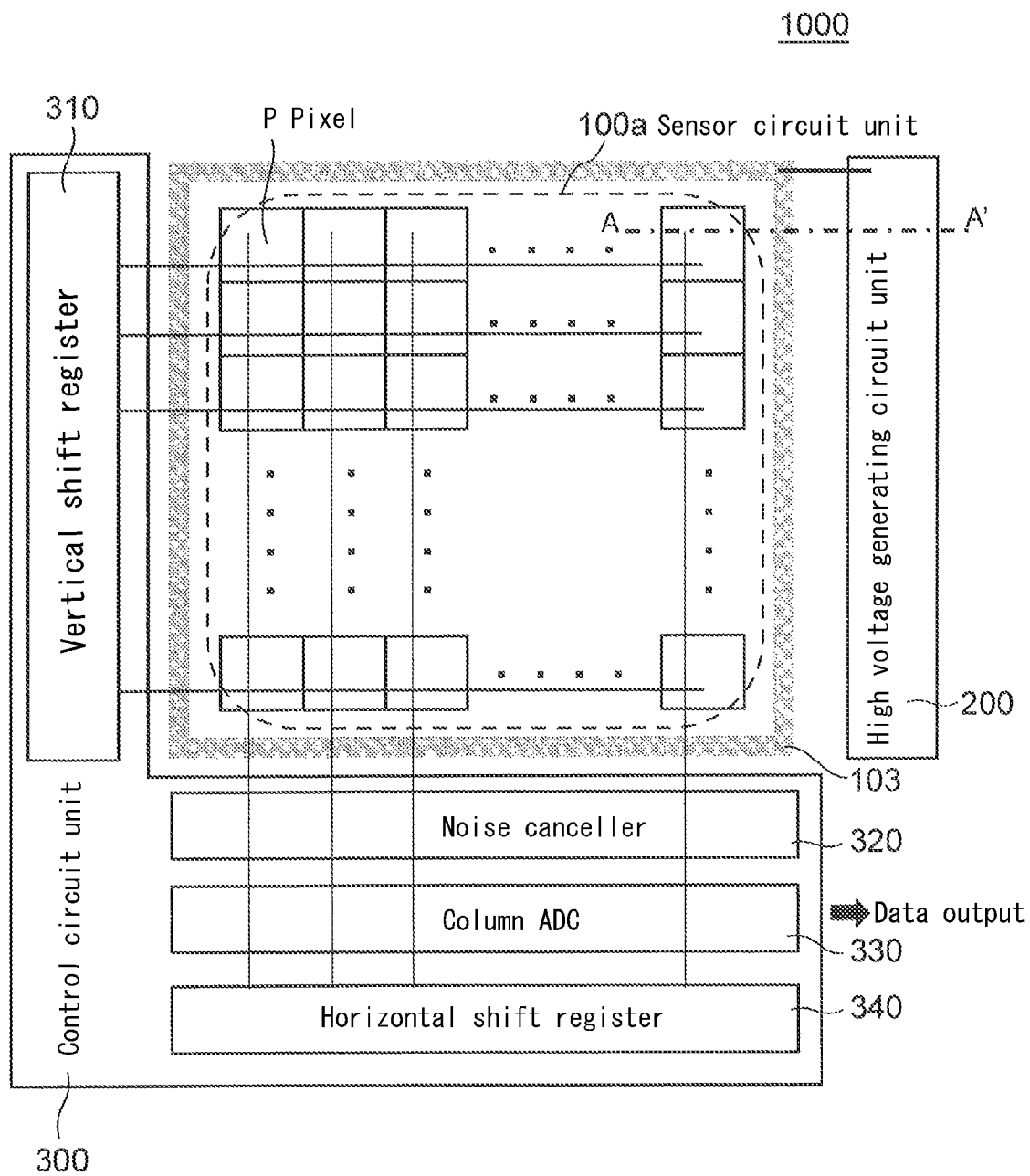
FIG. 6 is a schematic plan view showing a configuration of an optical sensor according to the first embodiment of the present invention.
Figure 7:
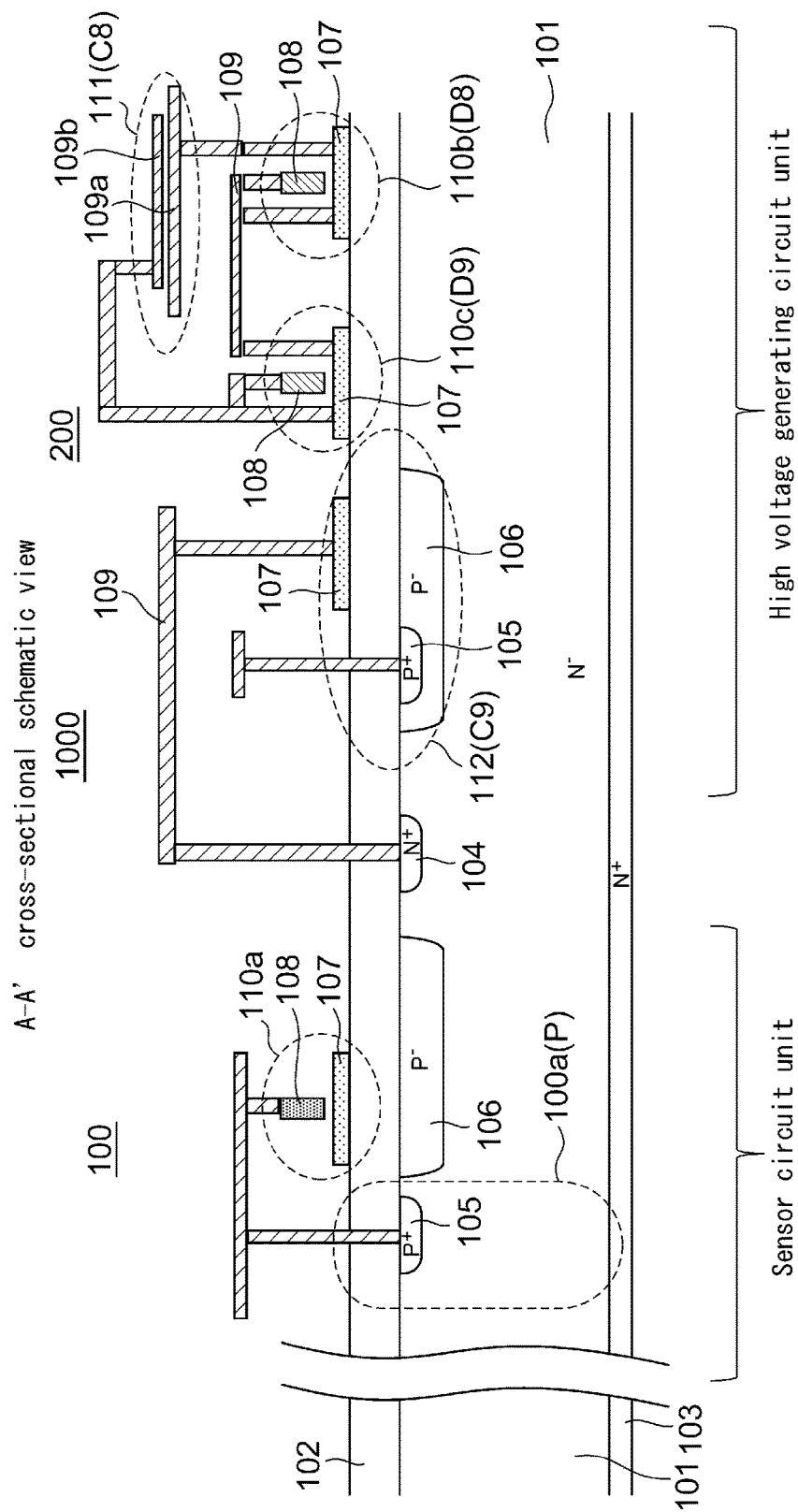
FIG. 7 is an A-A' cross-sectional schematic view schematically showing an A-A' cross-section in FIG. 6.

FIG. 6 is a schematic plan view showing a configuration of an optical sensor according to the first embodiment of the present invention, and FIG. 7 is an A-A' cross-sectional schematic view schematically showing an A-A' cross-section in FIG. 6.

An optical sensor 1000 according to the present invention is composed of a sensor circuit unit 100, a high voltage generating circuit unit 200, and a control circuit unit 300.

The sensor circuit unit 100 is composed of a light receiving element 100a and a MOS transistor 110a that detects a photocurrent passing through the light receiving element 100a. In the light receiving element 100a, a plurality of single sensor pixels P comprising pn junction diodes is arranged in an array to constitute the sensor circuit unit 100. As shown in FIG. 7, the light receiving element 100a uses an $N^+$ diffusion layer 103 formed on a backside of a low-concentration N-type silicon substrate 101 as a cathode electrode and a $P^+$ diffusion layer 105 formed near a main surface of the low-concentration N-type silicon substrate 101 as an anode electrode.

Figure 8:
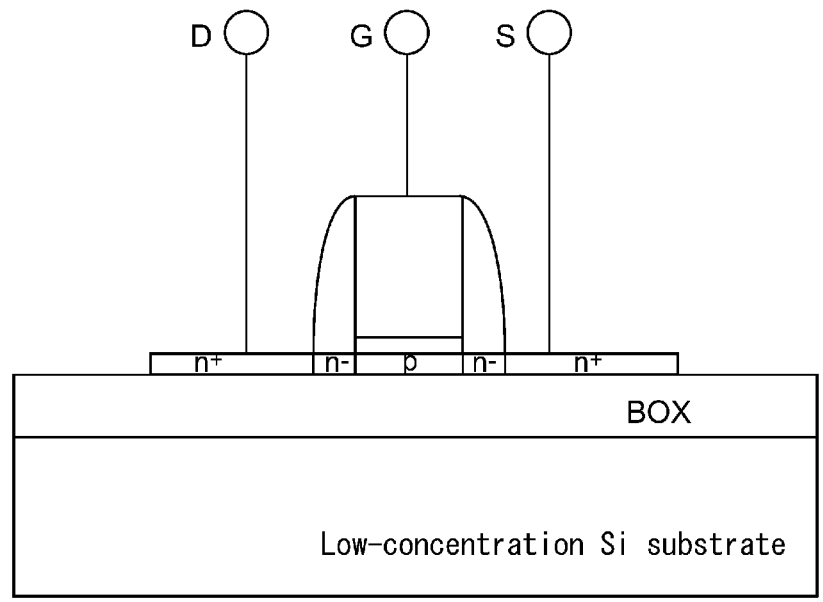
FIG. 8 is a cross-sectional structural view of a well-known LDD structure MOSFET.

In this manner, the light receiving element 100a is formed in a vertical direction to the main surface of the silicon substrate 101 under a buried oxide film (BOX) 102 of a SOI substrate including the silicon substrate 101, the buried oxide film 102 formed on the silicon substrate, and a semiconductor layer (SOI layer) 107 formed on the BOX 102, and an impurity concentration of the silicon substrate 101 and its film thickness are selected to have sufficient sensitivity to near-infrared light of about 800 nm to 1000 nm wavelength. The MOS transistor 110a detecting a photocurrent is formed on the SOI layer 107 and is a well-known LDD structure MOSFET as shown in FIG. 8.

The impurity concentration of the silicon substrate 101 is selected in a range of $1\times10^{12}/cm^3$ to $1\times10^{14}/cm^3$, preferably to be $2\times10^{12}/cm^3$. The thickness of the silicon substrate 101 is selected to be a silicon thickness that allows the light receiving element 100a to be fully depleted, for example, a final wafer thickness of 300 μm to 700 μm, preferably 500 μm. The $N^+$ layer 103 is formed on the backside by etching away the silicon on the backside, then ion-implanting phosphorus (P) into the backside and performing laser irradiation (laser annealing) from the backside for activation.

This $N^+$ layer 103 is formed in order to prevent the depletion layer extending from the main surface from reaching the bottom of the backside and to sufficiently reduce backside resistance by the entire pixel array.

The control circuit unit 300 controls the sensor circuit unit 100, is composed of a vertical shift register 310, a noise canceller 320, a column ADC 330, and a horizontal shift register 340, and is disposed at a periphery of the sensor circuit unit.

It is to be noted that since the control circuit unit 300 is not directly related to the present invention, its configuration and structure will not be described.

Figure 1:
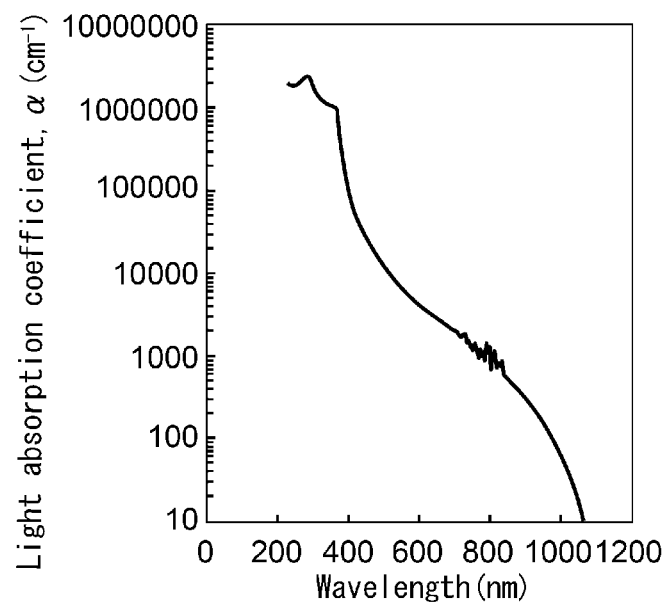
FIG. 1 is a view showing a relationship between a wavelength of light using silicon as a medium and a light absorption coefficient.
Figure 2:
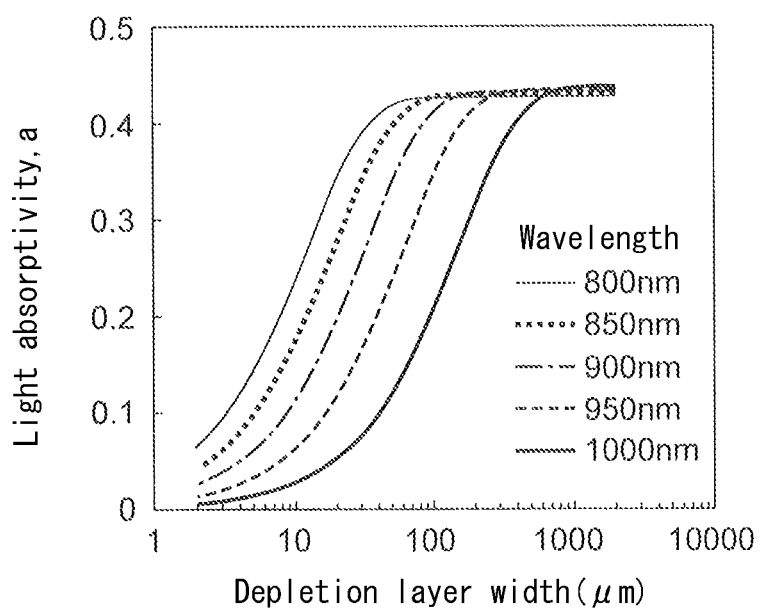
FIG. 2 is a view showing a relationship between a depletion layer width and light absorptivity for each light wavelength.
Figure 3:
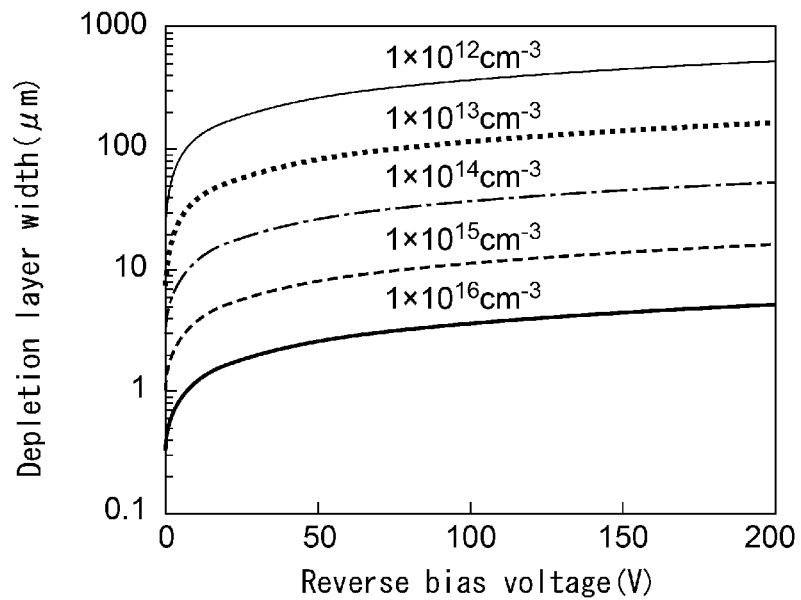
FIG. 3 is a view showing a relationship between a reverse bias voltage and a depletion layer width using an impurity concentration of the silicon substrate in which a pn junction is formed, as a parameter.
Figure 4:
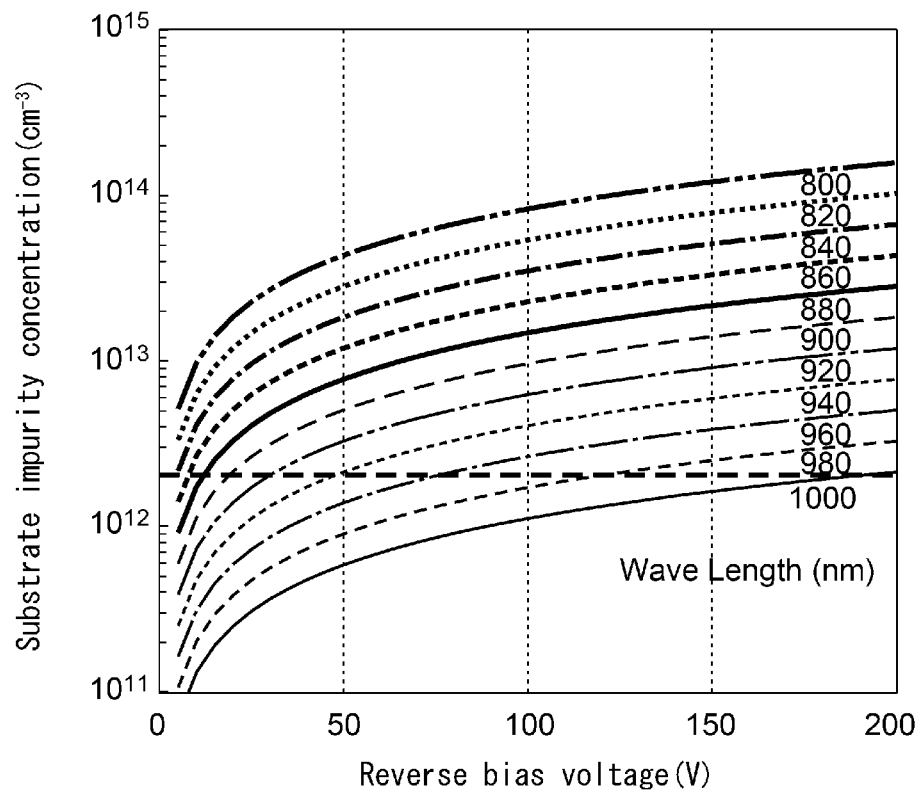
FIG. 4 is a view showing a relationship between a reverse bias voltage and a substrate impurity concentration to have a similar degree of sensitivity to visible light, using a light wavelength as a parameter.
Figure 5:
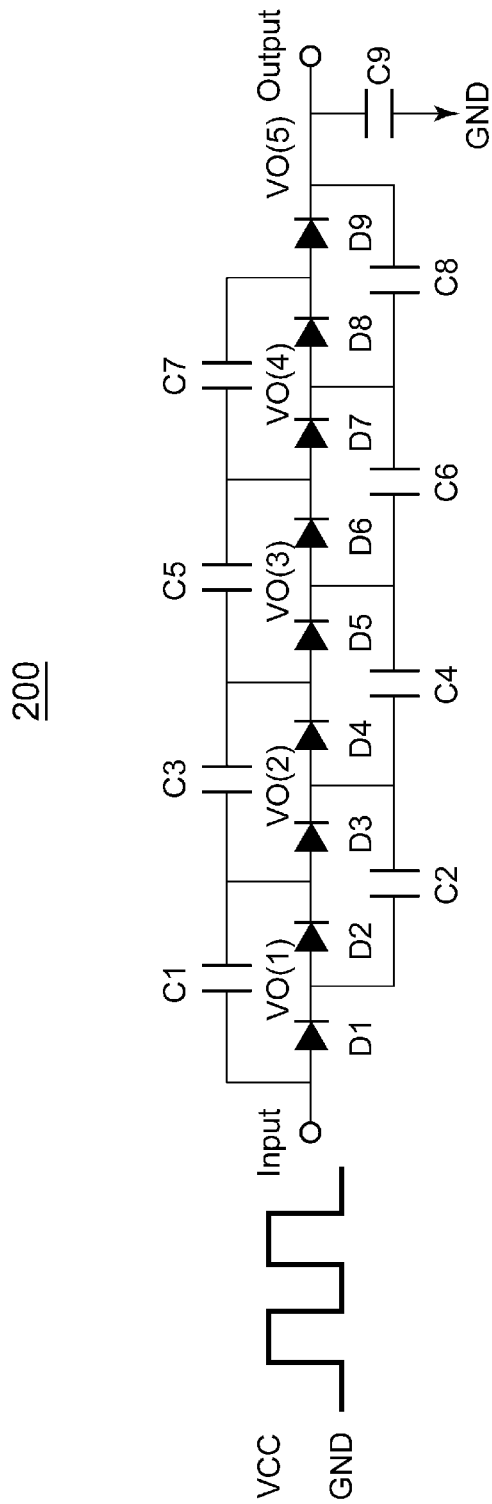
FIG. 5 is a view showing one example of a charge pump circuit that is realized by turning an input signal on and off using capacitors and diodes.

The high voltage generating circuit unit 200 is configured as the charge pump circuit using the capacitors (C1 to C9) and the diodes (D1 to D9) as shown in FIG. 5 as an example. It is to be noted that FIG. 7 shows a part of the charge pump circuit shown in FIG. 5 and two MOS transistors 110b and 110c that are formed on the SOI layer 107 and diode-connected correspond to the diodes D8 and D9 shown in FIG. 5, respectively.

In addition, an MIM capacitor 111 corresponds to the capacitor C8 and a BOX capacitor 112 corresponds to the capacitor C9. The other diodes (D1 to D7) and capacitors (C1 to C7) shown in FIG. 5 are not shown. The structure of the two MOS transistors 110b and 110c is the well-known LDD structure MOSFET shown in FIG. 8 as with that of the MOS transistor 110a.

The high voltage VO(5) generated in the high voltage generating circuit unit 200 shown in FIG. 5 is supplied to the $N^+$ layer 103 under the silicon substrate 101 provided at a periphery of the sensor circuit unit 100 via a metal wiring layer not shown, the silicon substrate 101 is entirely maintained at a high voltage, and a depletion layer that is sufficiently thick from the $P^+$ diffusion layer 105 in the light receiving element 100a toward the backside of the silicon substrate 101 is formed in the silicon substrate 101.

The capacitor 111 (C8) is formed as a MIM capacitor that is obtained by depositing an SiON film serving as an insulation layer on an underlying aluminum wiring 109a by a CVD method, and then depositing TiN thereon and patterning it to make up a counter electrode 109b. The capacitor 112 (C9) is connected to an output of the high voltage generating circuit unit 200, uses the buried oxide film (BOX) 102 as an insulation layer in order to ensure a high withstand voltage, uses the SOI layer 107 as one electrode and the $P^+$ diffusion layer 105 formed in a P-well layer 106 in the silicon substrate 101 as another electrode, and has a sufficiently high withstand voltage of 50 V or greater if the film thickness of the BOX is selected to be 100 nm to 300 nm.

FIG. 5 shows a five-stage charge pump circuit as an example, which outputs a DC voltage of five times a High level (Vcc) of an input clock.

When an input is a clock signal of the power-supply voltage VCC, an output voltage of an N-stage charge pump circuit is:

$$V_{out}(N) = VCC \times N - Vf \times 2(N-1) \quad (1)$$

Where Vf is a threshold voltage of a diode-connected MOSFET.

In this manner, preparation of a charge pump circuit with a moderate number of stages can generate a desired high voltage (for example, 10 V to 60 V) from the power-supply voltage VCC.

In the circuit shown in FIG. 5, since a voltage difference $V_{diff}$ at each stage is:

$$V_{diff} = Vcc - 2Vf \quad (2)$$

only a voltage of VCC or lower is applied between both terminals of each diode D1 to D9.

Figure 9:
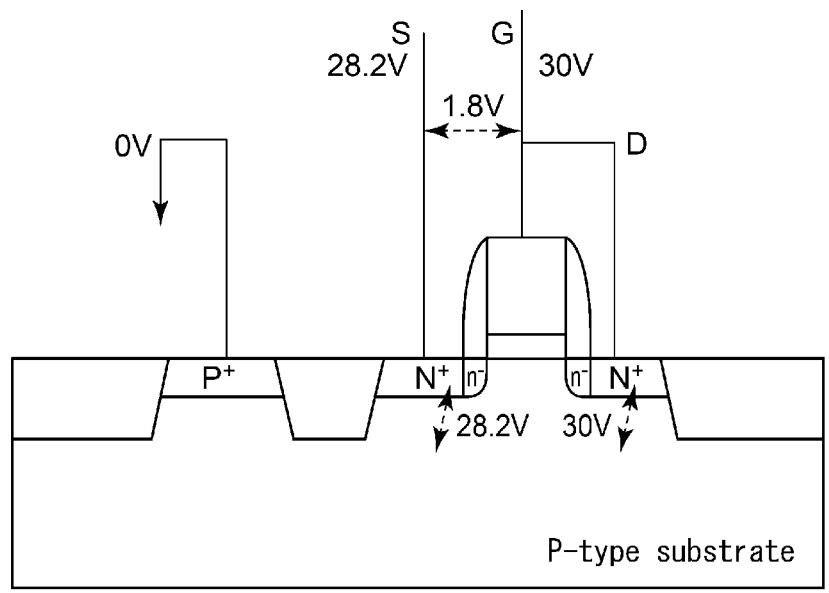
FIG. 9 is a cross-sectional structural view when an MOSFET is formed in a bulk (silicon substrate).

However, when a MOSFET is formed in a bulk (silicon substrate) as in an ordinary LSI, a high voltage (for example, 30 V) is directly applied to a drain junction of a post-stage diode-connected FET as shown in FIG. 9 (It is to be noted that a threshold voltage (1.8 V) is applied between the gate (G) and source (S).). Therefore, this has required inclining the junction to mitigate an electric field so that the pn junction can withstand this high voltage, brought complication because an additional process is needed, and led to an increase in an area of the MOSFET.

Figure 10:
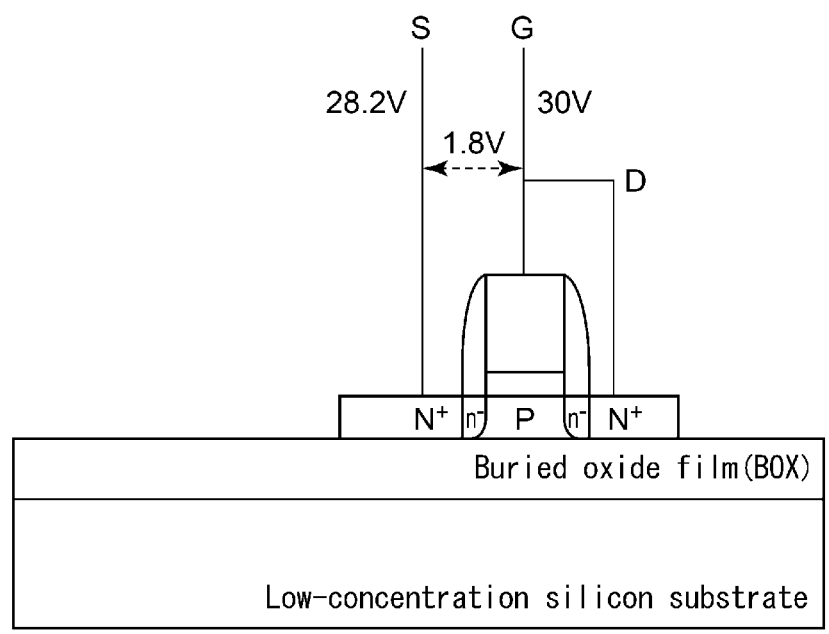
FIG. 10 is a cross-sectional structural view when MOSFETs are formed mutually separately in a semiconductor layer on a buried oxide film (BOX).

In contrast, in the present invention, the MOSFET serving as a diode is formed mutually separately in the semiconductor layer on the buried oxide film (BOX) as shown in FIG. 10. Therefore, the diodes at respective stages are completely separated, a withstand voltage sufficient to withstand the power-supply voltage VCC suffices, and the MOSFET operable at a normal power-supply voltage VCC can be used even in the case of the high voltage generating circuit.

In addition, the MIM capacitor 111 as shown in FIG. 7 can be used because only a voltage of VCC or lower is also applied to the capacitors C1 to C8.

However, a high voltage is directly applied to the capacitor C9 for output voltage stabilization, and thus it is necessary to ensure a withstand voltage for the capacitor. In the present invention, a sufficient withstand voltage is ensured by using the BOX 102 of a thickness of 100 to 300 nm.

It is to be noted that the capacitor C9 can be omitted because, in the high voltage generating circuit unit 200 shown in FIG. 7, a high voltage to be output is connected to one terminal ($N^+$ layer 103) of the pn junction capacitor of the light receiving element 100a.

In this manner, it is possible to manufacture a high-sensitivity near-infrared sensor having a single power supply and suppressing increases in process and area by combining an SOI substrate of a low impurity concentration and a high voltage generating circuit comprising a charge pump circuit in a semiconductor layer of the SOI substrate.

Then, a manufacturing process of the high voltage generating circuit unit 200 according to the first embodiment of the optical sensor 1000 of the present invention is described with reference to (A) of FIG. 11 to (Q) of FIG. 17.

First, as shown in (A) of FIG. 11, there is prepared as a starting material, a silicon substrate including an N-type phosphorus-doped low-concentration silicon substrate 501 whose impurity concentration is in a range of $1\times10^{12}/cm^3$ to $1\times10^{14}/cm^3$, a buried oxide film (BOX) 502 of 100 nm to 300 nm on the silicon substrate 501, and a thin boron-doped silicon layer (SOI layer) 503 whose film thickness is in a range of 10 nm to 100 nm and impurity concentration is about $1\times10^{15}/cm^3$ on the buried oxide film 502.

Such a silicon substrate is manufactured by a publicly-known smart cut method or lamination method and supplied by a wafer vendor.

Then, as shown in (B) of FIG. 11, the SOI layer 503 is patterned by photolithography using a resist and dry etching of silicon (Si) using the resist as a mask to form an active region.

It is to be noted that, in the drawing, an N channel MOSFET shall be formed on the left side and a P channel MOSFET on the right side.

Then, element isolation is performed as shown in (C) of FIG. 11. A gap between the active SOI layers 503 is filled with an element isolation oxide film 504 using STI (Shallow Trench Isolation), which is a well-known element isolation technique.

Then, as shown in (D) of FIG. 11, using photolithography and ion-implanting technique using a resist as a mask, boron ($BF_2^+$) is doped on the SOI layer 503a at the N channel MOSFET side, phosphorus ($P^+$) is doped on the SOI layer 503b at the P channel MOSFET side, and ion-implanting is performed with desired dose energy so as to be each desired threshold.

Then, as shown in (E) of FIG. 12, boron ($B^+$) is implanted into the underlying silicon substrate 501 using a resist pattern 505 made by photolithography as a mask to form a low-concentration P-well layer 506. At that time, only a little boron is implanted into the SOI layers 503a and 503b at an upper level and thus their impurity concentrations are nearly unchanged. The resist pattern 505 is removed after the ion-implantation.

Then, as shown in (F) of FIG. 12, a gate oxide film (silicon oxide film) 507 is formed on the SOI layers 503a and 503b by thermal oxidation.

Then, as shown in (G) of FIG. 12, polysilicon serving as a gate electrode is deposited on the entire surface by a CVD (Chemical Vapor Deposition) to form a gate electrode 508 made of polysilicon by photolithography and dry etching using a resist as a mask.

Then, as shown in (H) of FIG. 12, in order to form a contact with the underlying silicon substrate 501, the element isolation oxide film 504 and the buried oxide film 502 at a contact part are removed by photolithography and dry etching using a resist as a mask to form a BOX window.

Then, as shown in (I) of FIG. 13, a $P^+$ layer 509 serving as a sense node is formed by ordinary photolithography and ion-implantation of boron ($B^+$) using a resist as a mask. The resist is removed after the ion-implantation.

Then, as shown in (J) of FIG. 13, by photolithography and ion-implantation using the gate electrode 508 as a mask, a source-drain $n^+$ layer 510 implanted with arsenic (As) is formed at the N channel MOSFET side and a source-drain $p^+$ layer 511 implanted with boron ($BF_2$) is formed at the P channel MOSFET side. It is to be noted that, by forming a side wall (SW) on the gate electrode 508 by a well-known method, an $n^-$ layer is formed inside the source-drain $n^+$ layer and a player is formed inside the source-drain $p^+$ layer to make it possible to obtain an LDD type MOSFET.

In order to activate impurities in these diffusion layer (the source-drain $n^+$ layer 510 and source-drain $p^+$ layer 511) including the sense node $P^+$ layer 509, thermal processing (annealing) at a high temperature (about 1000° C.) for about ten seconds is performed in a nitrogen ($N_2$) atmosphere.

Then, as shown in (K) of FIG. 13, an interlayer insulation film (silicon oxide film) 512 is deposited over the entire surface by the CDV and chemical mechanical polishing (CMP) is performed for surface flattening.

Subsequently, as shown in (L) of FIG. 13, contact holes for electrically connecting elements are formed in the interlayer insulation film by photolithography and dry etching using a resist as a mask.

Then, as shown in (M) of FIG. 14, barrier metal (Ti/TiN) and tungsten (W) not shown are deposited by the CVD in order for the contact to be filled with a conductive substance, and subsequently W and Ti/TiN on the interlayer insulation film 512 are removed by the CMP to form an M1 tungsten plug 513.

Then, as shown in (N) of FIG. 14, Ti/TiN/Al—Cu/Ti/TiN are sequentially sputtered and an M1 wiring 514 is formed by photolithography and dry etching using a resist as a mask. After this, a plurality of M1 wirings 514 can be formed on the interlayer insulation film 512 by repeating deposition of an insulation film, flattening (CMP), via hole formation, plug embedding, and patterning for wiring layer formation, not shown.

Then, as shown in (O) of FIG. 15, when an MIM capacitor is formed on an M2 wiring 517 in the second layer, connected to an M2 tungsten plug 516, the MIM capacitor is formed by, after patterning of the M2 wiring 517, depositing an SiON film serving as an insulation film of the capacitor on the M2 wiring 517 by the CVD, and subsequently sputtering and patterning an MIM electrode 519 that is made of TiN and serves as a counter electrode of the capacitor.

Then, as shown in (P) of FIG. 16, surface treatment is completed by depositing an M2-M3 layer insulation film 520 on the entire surface, sputtering an M3 tungsten plug into a contact hole, repeating the same processes as described in (N) of FIG. 14 and (O) of FIG. 15 to form an M3 wiring 522, and providing a desired opening in a passivation 523 to form a bonding pad.

Finally, in order to obtain a final wafer thickness of 300 μm to 700 μm so that the sensor can be fully depleted, the backside of the silicon substrate 501 is ground and a damage layer is removed by wet etching. Subsequently, phosphorus is ion-implanted into the backside and laser annealing is performed from the backside for activation, and subsequently an n$^+$ layer 524 is formed on the backside of the silicon substrate 501.

It is to be noted that, for the diodes (D1 to D9) that are used in the high voltage generating circuit unit 200 in the first embodiment, the N channel MOSFET formed in (J) of FIG. 13 is used with the drain (D) and gate (G) connected, as shown in FIG. 10.

In the second embodiment of the present invention, as shown in FIG. 18, a first region 603b and a second region 603c that are in contact with each other with a channel region 603a between them are formed in an SOI layer 603 that is a semiconductor layer on a buried oxide film (BOX) 602, a gate electrode 608 formed on the channel region 603a via a gate oxide film 607 is included, the first region 603b and the channel region 603a have the same conductivity type, the second region 603c and the channel region 603a have different conductivity types from each other, the gate electrode 608 and the second region 603c are connected to use the first region 603b and the second region 603c via the channel region 603a as the diodes (D1 to D9).

The diode as shown in FIG. 18 is almost equal in structure to the SOI-MOSFET shown in FIG. 10 and the process flow itself described with reference to (A) of FIG. 11 to (Q) of FIG. 17 is nearly unchanged.

That is, in (D) of FIG. 11, both the SOI layers 503a and 503b are doped with phosphorus (P$^+$), and in (J) of FIG. 13, the source(S) of the P channel MOSFET on the right side is only changed from the p$^+$/p$^-$ layer to the n$^+$/n$^-$ layer, and in ion-implantation into the source and drain, if arsenic (As$^+$) and boron (BF$_2^+$) are selectively implanted using a resist as a mask with the center of the gate electrode 508 as a boundary as shown in FIG. 19, the diode as shown in FIG. 18 can be made.

FIG. 20 is a view showing a result of measuring quantum efficiency for a light wavelength when the light receiving element as shown in FIG. 7 is irradiated with light from the backside. It is to be noted that a reverse bias voltage applied to the pn junction is 30 V.

It is found that, compared to the sensor shown in Non-Patent Document 1, the sensor according to the present invention can achieve significantly high quantum efficiency for near-infrared light having a light wavelength of 900 nm to 1,000 nm.

Then, as for three types of diodes that are used in an SOI structure within a charge pump, a leak current when they are reverse biased is considered.

An increase in the leak current worsens boost effect of the charge pump circuit, the number of stages of the diode-capacitor set for boosting to a desired voltage must be increased, which leads to a problem of an increase in area.

(A) to (C) of FIG. 21 comparatively show structures of the three types of diodes, (A) is the diode described in Patent Document 2, (B) is one that is configured by diode-connecting the MOSFET and used in the first embodiment of the present invention (refer to FIG. 10), and (C) is one that is used in the second embodiment of the present invention (refer to FIG. 18).

In the diode having the structure shown in (A), the surface shown by the arrow is, structurally or process-wise, susceptible to process damage, and oxidation for reducing surface states cannot also be carried out. Therefore, there are many interface states and a depletion layer is in contact with this interface when reverse biased, and thus there is a drawback that a surface recombination current via the interface state flows and a leak current increases.

In the diode having the structure shown in (B), surface states are few compared to those in (A) because the gate oxide film is formed on the channel region. However, there is a drawback that a leak current when reverse biased is increased due to a so-called GIDL (Gate Induced Drain Leakage).

In the diode having the structure shown in (C), because a depletion layer is formed at a gate oxide film in an interface between the silicon surface and the oxide film of the SOI, the interface is a good one and there are few interface states, and thus a leak current via the states is suppressed.

When a reverse bias is applied, the GIDL can be generated at an n$^+$/n$^-$/n portion. However, since it is the n$^+$/n$^-$/n structure, the depletion layer is easy to be spread in a lateral direction and can sufficiently mitigate a lateral electric field. Therefore, the quantity of generation of the GIDL is sufficiently reduced.

FIG. 22 is a view showing a relationship between a reverse bias voltage and a leak current in the three diode structures shown in (A) to (C) of FIG. 21.

By setting the reverse bias voltage to −1.8 V and using the diode shown in (C) of FIG. 21, the leak current becomes less than or equal to a measurement limit and the leak current can be reduced by about two or more orders of magnitude compared to the diode shown in (A) of FIG. 21.

The invention claimed is:

1. A semiconductor image sensor comprising:
a light receiving element formed in a silicon substrate under an insulation film of an SOI substrate comprising the silicon substrate having a main surface and a backside surface opposed to the main surface, the insulation film formed on the main surface of the silicon substrate and having a backside surface contacting with the main surface of the silicon substrate and a frontside surface opposed to the backside surface, and a semiconductor layer formed on the frontside surface of the insulation film, and composed of a pn junction diode formed in a vertical direction to the main surface of the silicon substrate and having sensitivity to near-infrared light; and
a high voltage generating circuit configured to generate an applied voltage for applying a reverse bias voltage to the pn junction diode,
a BOX capacitor having a first electrode as a portion of the semiconductor layer formed on the frontside surface of the insulation film and a second electrode as a first P$^+$ diffusion layer formed in a P- well layer formed in the silicon substrate so as to be located near the main surface of the silicon substrate, the first P$^+$ diffusion layer contacting with the backside surface of the insulation film,
wherein the first electrode is connected to an output of the high voltage generating circuit, the pn junction diode contains a second P+ diffusion layer formed in the silicon substrate so as to be located near the main surface of the silicon substrate and an N+ diffusion layer formed on the backside surface of the silicon substrate, an impurity concentration of a portion of the silicon substrate excluding the first $P^+$ diffusion layer, the second $P^+$ diffusion layer, and the P-well layer is in a range of $1\times10^{12}/cm^3$ to $1\times10^{14}/cm^3$, a film thickness of the silicon substrate is in a range of 300 µm to 700 µm, and the applied voltage is in a range of 10 V to 60 V.

2. The semiconductor image sensor according to claim 1, wherein a film thickness of the insulation film of the SOI substrate is in a range of 100 nm to 300 nm.

3. The semiconductor image sensor according to claim 1, comprising a first region and a second region formed in the semiconductor layer on the insulation film and in contact with each other with a channel region therebetween, and a gate electrode formed on the channel region, the first region and the channel region having the same conductivity type, the second region and the channel region having different conductivity types from each other, wherein the gate electrode and the second region are connected to use the first region and the second region via the channel region as a diode, and a charge pump circuit configured to output a high voltage by connecting a plurality of the diodes in series and giving a signal to each diode is the high voltage generating circuit.

4. The semiconductor image sensor according to claim 1, wherein an impurity concentration of the semiconductor layer is in a range of $1\times10^{15}/cm^3$ to $3\times10^{18}/cm^3$, and a film thickness of the semiconductor layer is in a range of 10 nm to 100 nm.

* * * * *